United States Patent
Kang

(10) Patent No.: US 8,537,612 B2
(45) Date of Patent: Sep. 17, 2013

(54) NONVOLATILE MEMORY DEVICE, SYSTEM, AND PROGRAMMING METHOD

(71) Applicant: Samsung Electronics Co., Ltd., Suwon-si (KR)

(72) Inventor: Dongku Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/688,249

(22) Filed: Nov. 29, 2012

(65) Prior Publication Data

US 2013/0088923 A1   Apr. 11, 2013

Related U.S. Application Data

(63) Continuation of application No. 12/722,718, filed on Mar. 12, 2010, now Pat. No. 8,331,145.

(30) Foreign Application Priority Data

Mar. 25, 2009   (KR) .................. 10-2009-0025510

(51) Int. Cl.
*G11C 16/04* (2006.01)
*G11C 16/10* (2006.01)

(52) U.S. Cl.
CPC .................. *G11C 16/10* (2013.01)
USPC ............ 365/185.03; 365/185.14; 365/185.24; 365/185.17; 365/185.22

(58) Field of Classification Search
CPC . G11C 16/10; G11C 16/12; G11C 2211/5621
USPC ............ 365/185.03, 185.18, 185.17, 185.11
See application file for complete search history.

(56) References Cited

U.S. PATENT DOCUMENTS

| 6,549,457 | B1 | 4/2003 | Srinivasan et al. | |
|---|---|---|---|---|
| 7,327,609 | B2 * | 2/2008 | Kim et al. | ............... 365/185.22 |
| 2010/0002504 | A1 | 1/2010 | Kim et al. | |
| 2010/0174847 | A1 | 7/2010 | Paley et al. | |

FOREIGN PATENT DOCUMENTS

| KR | 100778082 B1 | 11/2007 |
|---|---|---|
| KR | 1020080018495 A | 2/2008 |
| KR | 1020080035353 A | 4/2008 |

* cited by examiner

*Primary Examiner* — Thong Q Le
(74) *Attorney, Agent, or Firm* — Volentine & Whitt, PLLC

(57) ABSTRACT

A method of programming a nonvolatile memory device comprises selectively programming memory cells from a first state to a second state based on lower bit data, selectively programming the memory cells from the second state to an intermediate state corresponding to the lower bit data, and selectively programming the memory cells from the intermediate state to a third or fourth state based on upper bit data.

6 Claims, 10 Drawing Sheets

NONVOLATILE MEMORY DEVICE, SYSTEM, AND PROGRAMMING METHOD

STATEMENT OF RELATED APPLICATION

This application is a Continuation Application of application Ser. No. 12/722,718, filed Mar. 12, 2010 now U.S. Pat. No. 8,331,145, which claims priority under 35 U.S.C. §119 to Korean Patent Application No. 10-2009-0025510 filed Mar. 25, 2009, the disclosure of which is hereby incorporated by reference in its entirety.

BACKGROUND

Embodiments of the inventive concept relate generally to semiconductor memory devices, and more particularly, to nonvolatile semiconductor memory devices and related methods of programming.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power.

Examples of volatile memory devices include dynamic random access memory (DRAM), static random access memory (SRAM), and examples of nonvolatile memory devices include electrically erasable programmable read only memory (EEPROM), ferroelectric random access memory (FRAM), phase-change random access memory (PRAM), magnetoresistive random access memory (MRAM), and flash memory.

In recent years, there has been an increase in the number of devices employing nonvolatile memory devices. As examples, nonvolatile memory devices are being used increasingly in MP3 players, digital cameras, cellular phones, camcorders, flash cards, solid state drives (SSDs), to name but a few. In addition, there has also been an increase in the overall storage capacity of nonvolatile memory devices, resulting in a tremendous amount of nonvolatile data storage in use today.

The storage capacity of a nonvolatile memory device may be further increased by storing more than one bit of data in each memory cell. Nonvolatile memory devices storing more than one bit of data in each memory cell are called multi-level cell (MLC) devices because the memory cells store multiple levels of data, e.g., lower level bits, upper level bits, mid-level bits, and so on.

Unfortunately, conventional programming methods for MLC devices may produce errors for any of several reasons. For instance, in some devices, the programming of upper level bits may interfere with lower level bits that have already been programmed. Such interference may occur, for example, where power is lost during programming of the upper level bits, or programming of the upper level bits fails. Under certain circumstances, these events may even cause lower level bits to be overwritten or flipped.

SUMMARY

Embodiments of the inventive concept provide various nonvolatile memory devices, systems, and methods of programming such nonvolatile memory devices and systems.

According to one embodiment of the inventive concept, a method of programming a nonvolatile memory device comprises selectively programming memory cells in a first state to a second state based on lower bit data, the first state corresponding to a first threshold voltage distribution and the second state corresponding to a second threshold voltage distribution greater than the first threshold voltage distribution. The memory cells in the second state are then programmed to a third state corresponding to a third threshold voltage distribution overlapping with and being narrower than the second threshold voltage distribution. Thereafter, the memory cells in the third state are selectively programmed to a fourth state based on upper bit data, the fourth state corresponding to a fourth threshold voltage distribution greater than the third threshold voltage distribution.

In certain embodiments, the method further comprises selectively programming memory cells in the first state to a fifth state based on the upper bit data, the fifth state corresponding to a fifth threshold voltage distribution greater than the first threshold voltage distribution and lower than the third threshold voltage distribution. Moreover, in certain embodiments, the fifth threshold voltage distribution overlaps with a lower portion of the second threshold voltage distribution.

In certain embodiments, the second threshold voltage distribution is formed using a first verification voltage, the third threshold voltage distribution is formed using a second verification voltage greater than the first verification voltage, and the fourth threshold voltage distribution is formed using a third verification voltage greater than the second verification voltage.

In certain embodiments, programming the memory cells from the second state to the third state prevents the memory cells from losing the lower bit data if power is lost during programming of the upper bit data.

In certain embodiments, the lower bit data comprises M-bit data, where M is an integer greater than or equal to two, and the upper bit data comprises M+1 bit data. Moreover, in certain embodiments, the first state corresponds to stored data '11', the fifth state corresponds to stored data '01', the third state corresponds to stored data '00' and the fourth state corresponds to stored data '10'.

According to another embodiment of the inventive concept, a memory system comprises a nonvolatile memory device and a controller configured to control the nonvolatile memory device. The nonvolatile memory device comprises a memory cell array, a data input/output circuit configured to receive data from and supply data to the memory cell array, and a program control logic component configured to control the data input/output circuit. The program control logic component is configured to selectively program memory cells in a first state to a second state based on lower bit data, program the memory cells in the second state to a third state in an intermediate operation, and selectively program memory cells in the third state to a fourth state based on upper bit data, wherein the first state corresponds to a first threshold voltage distribution, the second state corresponds to a second threshold voltage distribution greater than the first threshold voltage distribution, the third state corresponds to a third threshold voltage distribution overlapping with and narrower than the second threshold voltage distribution, and the fourth state corresponds to a fourth threshold voltage distribution greater than the third threshold voltage distribution.

According to still another embodiment of the inventive concept, a nonvolatile memory device comprises a memory cell array comprising memory cells arranged in rows and columns, a read/write circuit configured to receive data from and supply data to the memory cell array, and a control logic component configured to control the read/write circuit such that memory cells in a first program state are programmed to an intermediate program state representing the same logic value as the first program state and then subsequently programmed from the intermediate program state to a second program state representing the logic value of the first program state and further representing an additional logic value.

BRIEF DESCRIPTION OF THE DRAWINGS

Embodiments of the inventive concept will be more clearly understood from the following detailed description taken in conjunction with the accompanying drawings. In the drawings, like reference numbers denote like features.

DESCRIPTION OF THE EMBODIMENTS

Figure 1:
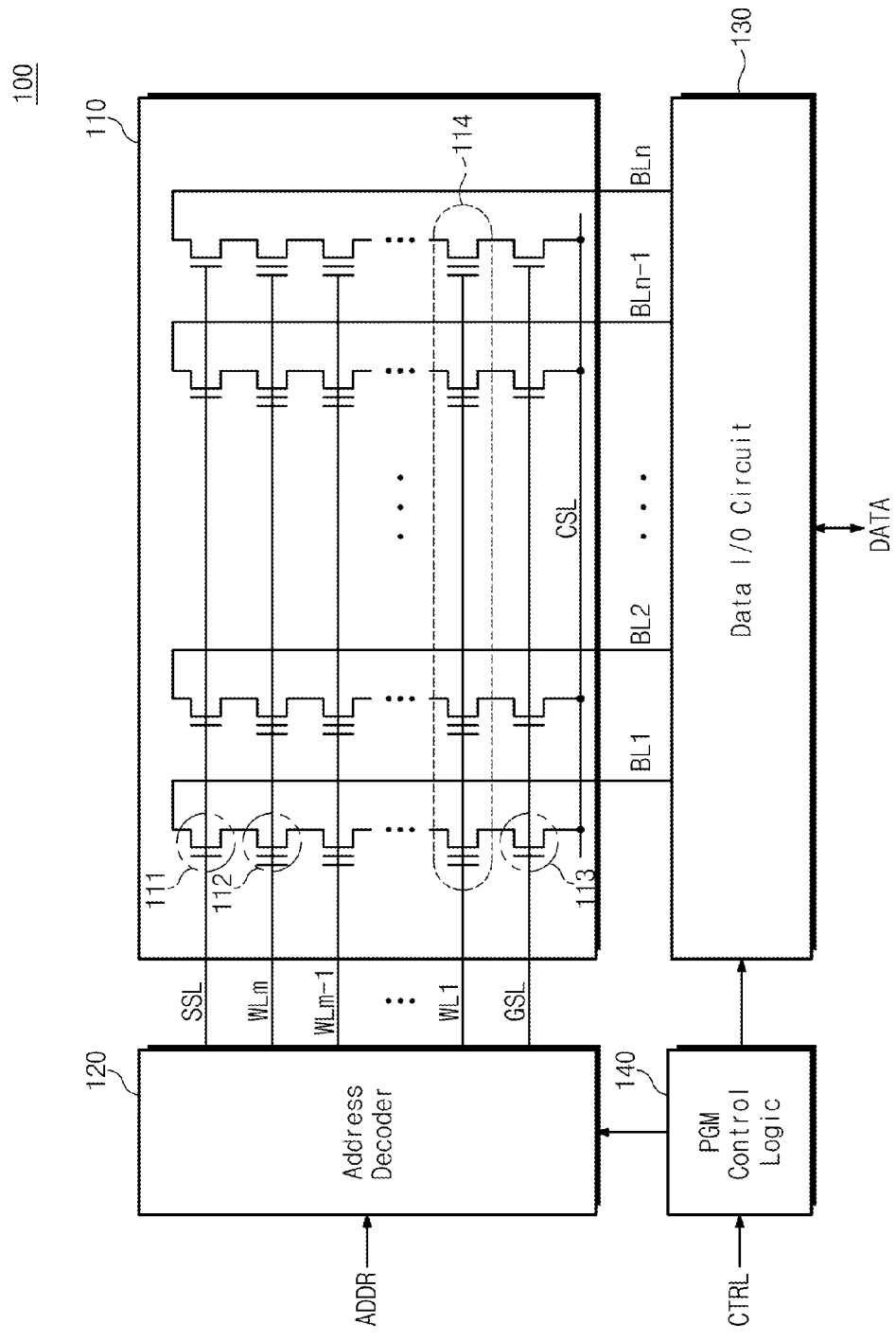
FIG. 1 is a block diagram illustrating a flash memory device according to an embodiment of the inventive concept.

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when an element is referred to as being "between" two other elements, it can be the only element between the two other elements, or one or more intervening elements may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, embodiments of the inventive concept will be explained in some additional detail with reference to the accompanying drawings.

FIG. 1 is a block diagram illustrating a flash memory 100 according to an embodiment of the inventive concept. Flash memory 100 comprises a memory cell array 110, an address decoder 120, a data input/output (I/O) circuit 130, and program control logic 140.

Memory cell array 110 comprises string select transistors 111, memory cells 112, and ground select transistors 113. Memory cells 112 in the same row are connected to the same word line, which is connected to address decoder 120.

Where memory cells 112 constitute single level cells (SLCs) each storing one bit of data, memory cells 112 connected to the same word line constitute a page 114. On the other hand, where memory cells 112 constitute multi-level cells (MLCs), memory cells 112 connected with to the same word line may constitute a plurality of pages. For example, where memory cells 112 each store two bits, a set of memory cells commonly connected with one word line may constitute two pages.

Gates of string select transistors 111 in the same row are connected through a string select line SSL to address decoder 120. Drains of string select transistors 111 are connected through corresponding bit lines BL1 through BLn to data input/output circuit 130. Gates of ground select transistors 113 in the same row are connected through a ground select line SSL to address decoder 120.

Address decoder 120 is connected to memory cell array 110 via word lines WL1 through WLm and is controlled by program control logic 140. Address decoder 120 is configured to receive an address ADDR from an external device. Address ADDR typically comprises a row address and a column address. Address decoder 120 decodes address ADDR to produce the row address, and uses the row address to select word lines WL1 through WLm. Address decoder 120 also decodes address ADDR to produce the column address, and provides the decoded column address to data input/output circuit 130. Data input/output circuit 130 selects bit lines BL1 through BLn in response to the decoded column address.

Data input/output circuit 130 operates under the control of program control logic 140. Data input/output circuit 130 is connected to memory cell array 110 via the bit lines BL1 through BLn. Data input/output circuit 130 is configured to temporarily data received from an external source. Data input/output circuit 130 is configured to read data stored in memory cell array 130 and to output the read data to an external device.

In some embodiments, data input/output circuit 130 comprises elements such as a column gate circuit, a page buffer, a data buffer, and the like, and in some embodiments, data input/output circuit 130 comprises elements such as a column gate circuit, a write driver, a sense amplifier, a data buffer.

Program control logic 140 operates in response to an external control signal CTRL and is configured to control data input/output circuit 130 and address decoder 120. For example, program control logic 140 may control an upper-bit programming operation and a lower-bit programming operation. In one embodiment, program control logic 140 is configured to control a first upper bit program operation, which will be more fully described below. In another embodiment, address decoder 120 and data input/output circuit 130 constitute a read/write circuit configured to read and program data from and to memory cell array 110. Additionally, program control logic 140 may be configured to control various operations, such as erase and copy-back operations, together with a program operation and a read operation.

FIG. 2A is a threshold voltage diagram illustrating the possible states of a 2-bit memory cell that has been programmed with lower bit data, and FIG. 2B is a threshold voltage diagram illustrating the possible states of a 2-bit memory cell that has been programmed with upper bit data. In FIGS. 2A and 2B, the horizontal axis measures threshold voltage, and the vertical axis indicates a number of memory cells having each respective threshold voltage. Each memory cell may be programmed to have one of four states corresponding to data '11', '01', '00' and '10' and the four different threshold voltage distributions shown in FIG. 2B.

Referring to FIG. 2A, a symbol "E" indicates a distribution of memory cells having an un-programmed, or erased state "E". A symbol "P0" indicates a distribution of memory cells in which lower bit data is programmed. This distribution corresponds to a programmed state "P0" of memory cells. A symbol "VR1" indicates a read voltage for a pre-read operation. A symbol "Vread" indicates a pass voltage of the pre-read operation. The pre-read operation will be described in further detail below.

In a program operation of lower bit data, lower bit data is loaded into a part of data input/output circuit 130, such as a page buffer. The page buffer may be configured to bias each bit line with a voltage corresponding to loaded data. Where the loaded data has a first logic state (e.g., data '1' or a logic state "high"), each bit line may be biased with a program-inhibition voltage (for example, Vcc) through the page buffer. Where the loaded data has a second logic state (e.g., data '0' or a logic state "low"), each bit line may be biased by a ground voltage through the page buffer.

Where a program operation of lower bit data is required, address decoder 120 may supply a program voltage Vpgm to a selected word line and a pass voltage Vpass to unselected word lines.

In some embodiments, it is assumed that memory cells 114 connected to a word line WL1 are being programmed. Where data loaded onto the page buffer has logic state "low" (e.g., data '0'), the page buffer may bias a bit line with a ground voltage.

Address decoder 120 may apply program voltage Vpgm through selected word line WL1 to memory cells 114 in a selected page. Address decoder 120 may supply pass voltage Vpass through unselected word lines WL2 through WLm to memory cells in unselected pages. In this case, memory cells in the selected page and connected with bit lines biased by the ground voltage may be programmed by the F-N tunneling.

Where the data loaded into the page buffer has a logic state "high" (e.g., data '1'), the page buffer may supply a program-inhibition voltage Vcc to bit lines BL1 through BLn while address decoder 120 applies program voltage Vpgm to word line WL1, which is connected to memory cells 114 in a selected page. Address decoder 120 may supply pass voltage Vpass via unselected word lines WL2 through WLm to memory cells in unselected pages. In this case, memory cells in the selected page and connected with bit lines each biased by the program-inhibition voltage may be prevented from being programmed since insufficient electric field will be generated to cause Fowler-Nordheim (F-N) tunneling.

After programming, a verify-read operation (or verify operation) may be carried out to verify whether memory cells are programmed to the desired/target threshold voltages. Where at least one of the programmed memory cells is judged not to have a desired threshold voltage, the program operation may be repeated with successively increasing values of program voltage Vpgm.

Referring to FIG. 2B, a process of programming upper bit data in a memory cell may comprise an initialization operation, a pre-read operation, a data loading operation, and a program operation.

During the initialization operation, latches in a page buffer of data input/output circuit 130 are set to a program-inhibition state. The page buffer in data input/output circuit 130 typically comprises two latches per bit line, denoted first and second latches; however, the structure of the first and second latches may be changed variously. For example, in multi-bit flash memory devices, a single latch structure may store multi-bit data read from or written to a memory cell array.

Following the initialization operation, data input/output circuit 130 reads data programmed in memory cells of a selected page. This reading process will be called a pre-read operation. In the pre-read operation, data input/output circuit 130 pre-charges bit lines BL1 through BLn with a pre-charge voltage. Address decoder 120 supplies read voltage VR1 to memory cells in memory cell array 110 via word line WL1. Address decoder 120 supplies a pass voltage Vread through unselected word line WL2 through WLm to memory cells in memory cell array 110.

The pre-read operation determines whether a threshold voltage of a memory cell has erase state "E" or program state "P0". For example, where a memory cell is turned on within the pre-read period, it is judged to have erase state "E", i.e., a threshold voltage lower than read voltage VR1. Where a memory cell is turned off within the pre-read period, it is judged to have a program state "P0", i.e., a threshold voltage higher than read voltage VR1. The judged lower bit data is stored in the first latch of the page buffer.

Once the pre-read operation is completed, upper bit data is transferred to data input/output circuit 130 in a data loading operation. The data loading operation is made under the control of program control logic 140. In the data loading operation, the upper bit data may be loaded onto the second latch of the page buffer in data input/output circuit 130.

Once the data loading operation is completed, program and program-verify operations are carried out. The program and program-verify operations of the upper bit data are similar to the program and program-verify operations of lower bit data.

While the upper bit data is being programmed, a program voltage Vpgm is applied through a selected word line to memory cells using incremental step pulse programming (ISPP). The ISPP may be used to program each memory cell to one of four threshold voltage distributions each defined by a threshold voltage window. The ISPP may be accomplished by iterating a loop in which a stepwise increasing program voltage Vpgm is applied to a selected word line and then a verify voltage is applied thereto. The process of programming upper bit data may be modified in a variety of ways. For example, the pre-read operation and the data loading operation may be carried out at the same time using the first latch and the second latch.

Returning to FIG. 2B, where the upper bit data is '1', memory cells in program state P0 may be programmed to have a program state P3. The programming of a memory cell from program state P0 to program state P3 is indicated in FIG. 2B by the label "Program1". Where the upper bit data is '0', memory cells in program state P0 may be programmed to a program state P2. The programming of a memory cell from program state P0 to program state P2 is indicated in FIG. 2B by the label "Program2". Memory cells in erase state "E" may be programmed to a program state P1 where upper bit data is '0'. On the other hand, where upper bit data is '1', memory cells may maintain erase state "E".

Referring to FIGS. 2A and 2B, memory cells in a range "X" denoted by dotted lines store lower bit data '1' when programmed with multi-bit data. On the other hand, memory cells having a threshold voltage to the right of read voltage VR2 store lower bit data '0' when programmed with multi-bit data. Accordingly, if power is lost during an upper bit program operation (e.g., a most significant bit (MSB) program operation), it may be difficult to determine and recover lower bit data stored in memory cells having threshold voltages within range "X".

To illustrate this difficulty, suppose that power is suddenly lost during an MSB program operation. The loss of power will interrupt the MSB program operation, preventing the MSB program from completing. Further suppose that the memory cell being programmed has a threshold voltage within range "X". In this case, if programming of the memory cell may have been interrupted due to a sudden loss of power while being programmed to program state P1 from erase state "E" (indicated by the label "Program3"), with the memory cell storing lower bit data '1'. On the other hand, however, the memory cell may have been interrupted due to the sudden loss of power while being programmed to program state P2 from program state P0 (indicated by the label "Program2"), with the memory cell storing lower bit data '0'. In other words, if power is lost during a programming operation of upper bit data, such as MSB data, it may be difficult to determine whether the previously programmed lower bit data is a '1' or a '0'.

A memory device may also lose power when being programmed from program state P0 to program state P3 (indicated by the label "Program1"). In this case, the memory cell may store lower bit data '0, and it may be difficult to determine lower bit data stored in memory cells within range "X".

As illustrated by the foregoing, in various situations, it may be difficult to determine and recover lower bit data of memory cells having threshold voltages within range "X" when a failure such as power disruption occurs during an upper bit program operation such as an MSB program operation.

Additionally, errors may occur when power is lost during a process where different data is sequentially stored in the same multi-level cells. For instance, suppose that a programming operation ends after input data is received (hereinafter, referred to as old data, or an old page of data) in a page of multi-level cells. The old data may be assumed to be stored in multi-level cells as lower bit data.

Then, suppose that power is lost when new data is input for another page corresponding to the same multi-level cells. Further, suppose that the new data is being programmed in the multi-level cells. In this case, it may be difficult to determine and recover old data in multi-level cells having threshold voltages in the range "X" after upper bit data has been programmed. This may occur due to the same reason as the case where the sudden power-off occurs during an MSB program operation.

Figure 2:
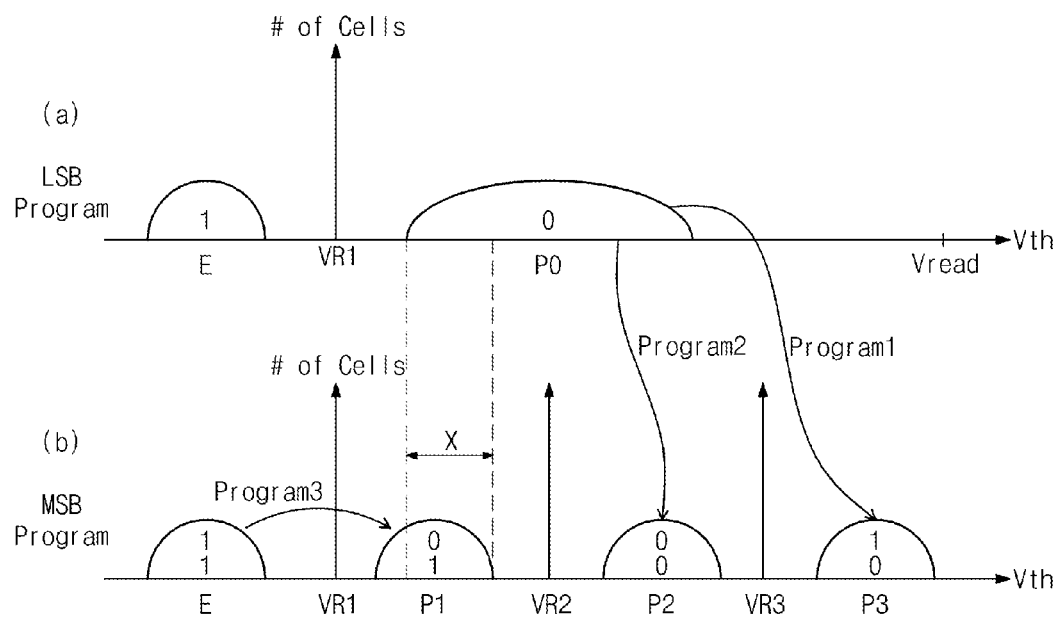
FIG. 2A is a threshold voltage diagram illustrating different program states that a memory cell may assume as a result of programming lower bit data in a 2-bit memory cell.
FIG. 2B is a threshold voltage diagram illustrating different program states that a memory cell may assume as a result of programming upper bit data in a 2-bit memory cell.

The mapping between threshold voltage distributions and logic states of memory cells may be changed variously. For example, as illustrated in FIG. 2, the four threshold voltage distributions are mapped to states '10', '00', '01', and '11' in this order. On the other hand, the threshold voltage distributions could alternatively be mapped to have states '01', '00', '10', and '11' in this order.

FIG. 3A is a threshold voltage diagram illustrating two possible initial states of a memory cell storing one bit of data (i.e., a least significant bit (LSB)) before being programmed with a second bit of data (i.e., an MSB). FIG. 3B is a threshold voltage diagram illustrating two possible states of the memory cell of FIG. 3A following a first stage of a two stage operation for programming a second bit of data. The first stage will be referred to as a first MSB program operation. FIG. 3C is a threshold voltage diagram illustrating four possible states of the memory cell of FIG. 3A following a second stage of the two stage operation for programming a second bit of data. The second stage will be referred to as a second MSB program operation.

Referring to FIG. 3A, after an LSB program operation is executed, memory cells may have erase state "E" or program state P0. The LSB program operation may be identical to that described in FIG. 2A, so additional description thereof will is omitted to avoid redundancy. Memory cells in program state P0 may store data '0', and memory cells in erase state "E" may store data '1'. A symbol VFY1 indicates a verify voltage used in a program-verify operation of lower bit data.

Figure 3:
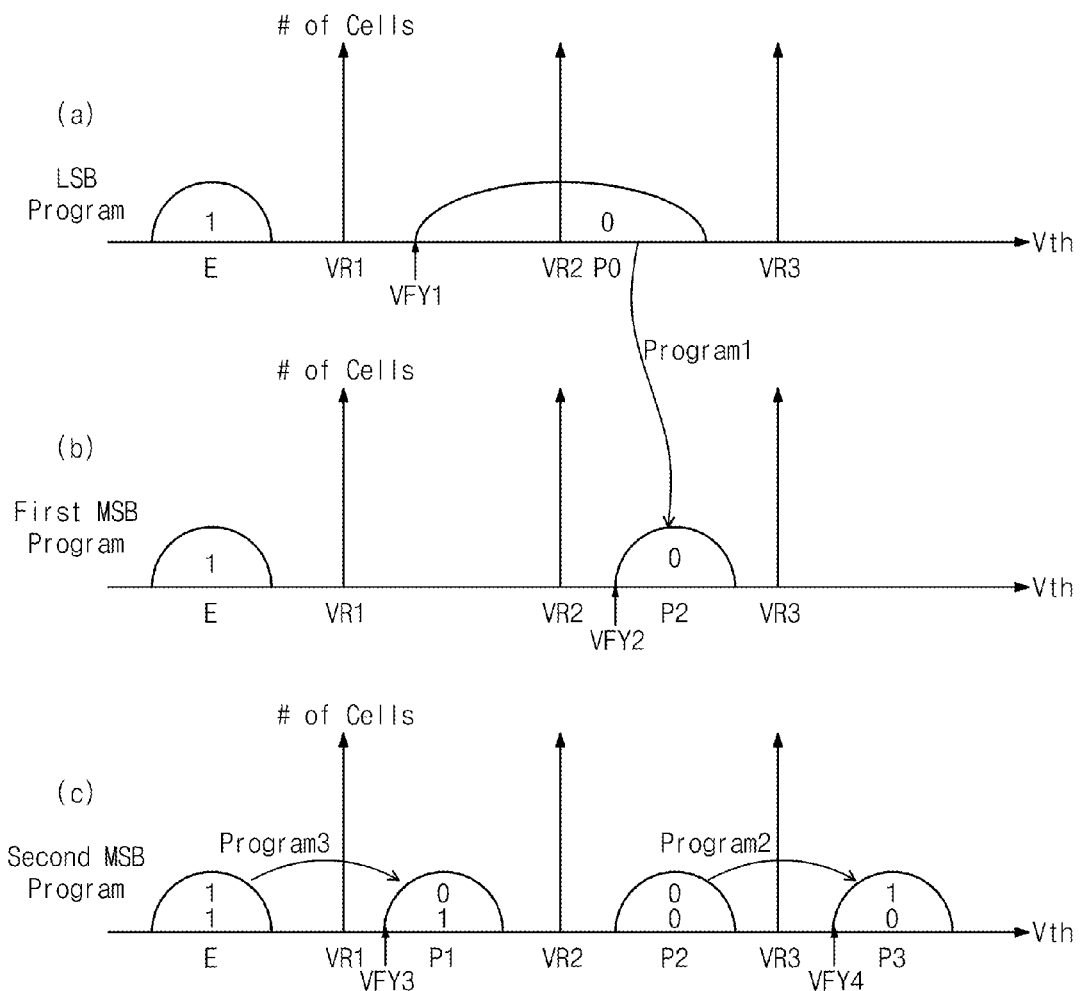
FIG. 3A is a threshold voltage diagram illustrating two possible initial states of a memory cell storing one bit of data before being programmed with a second bit of data.
FIG. 3B is a threshold voltage diagram illustrating two possible states of the memory cell of FIG. 3A following a first stage of a two stage operation for programming a second bit of data.
FIG. 3C is a threshold voltage diagram illustrating four possible states of the memory cell of FIG. 3A following a second stage of the two stage operation for programming a second bit of data.

Referring to FIG. 3B, during the first MSB program operation, a memory cell in program state P0 state may be programmed to program state P2, as illustrated by the label "Program1" in FIG. 3. The process of performing the first MSB program operation may comprise reading lower bit data and programming the memory cell in program state P0 to program state P2.

The lower bit data of memory cells may be read by applying read voltage VR1 to the memory cells. Where a memory cell attached to a selected word line is in program state P0, it may be turned off. In other words, because read voltage VR1 is lower than the threshold voltage of a memory cell in program state P0, a memory cell in program state P0 will not turn on when it receives read voltage VR1. On the other hand, where a memory cell connected to a selected word line is in erase state "E", it may be turned on. Following such a read operation, lower bit data may be transferred to corresponding latches. The process of reading lower bit data is similar to the process described above in relation to FIG. 2A, and therefore additional description thereof will be omitted to avoid redundancy.

Memory cells in program state P0 that have been programmed with LSB data may be subsequently programmed to program state P2. The program and program-verify processes may be similar to those described in FIGS. 2A and 2B. Accordingly, further descriptions thereof will be omitted to avoid redundancy.

Where memory cells in program state P0 are programmed to program state P2, a verify voltage VFY2 is used to verify proper programming and a read voltage VR2 is used for read operations. Additionally, ISPP may be used to ensure proper programming to program state P2. Memory cells in program state P2 have threshold voltages greater than verify voltage VFY2. Memory cells in program state P2 store LSB data '0'. During the first MSB program operation, memory cells in erase state "E" are not programmed, as indicated by FIG. 3B.

Referring to FIG. 3C, a memory cell may be programmed from program state P2 to program state P3 to store MSB data '1', as illustrated by the label "Program2". On the other hand, a memory cell may remain in program state P2 to store MSB data '0'. A memory cell may also be programmed from erase state "E" to program state P1 to store MSB data '0', as illustrated by the label "Program3". On the other hand, where a memory cell is in erase state "E" and is programmed with MSB data '1', the memory cell remains in erase state "E".

As indicated by the above description, after memory cells are programmed with lower bit data, such as first page data or LSB data, the memory cells may be subsequently programmed to a middle state such as program state P2 in FIG. 3B. Thereafter, the memory cells may be programmed with upper bit data, such as second page data or MSB data, by performing operations corresponding to the labels "Program3" and "Program2" The middle program state P2 may correspond to one of at least two program states (for example, P2 and P3) corresponding to the upper page data. Thus, the middle state and a corresponding program state may be determined by the same verification voltage (for example, VFY2). In this case, the middle program state P2 does not overlapped with another state (for example, program state P1), which is determined after or before programming memory cells in the middle state with upper bit data.

The program and program-verify processes of FIG. 3 may be similar to those described in FIGS. 2A and 2B, so additional description thereof will be omitted to avoid redundancy. In FIG. 3C, verify voltages VFY3 and VFY4 are used in program-verify operations, and read voltages VR1, VR2, and VR3 are used in read operations. Further, the above-described ISPP technique may be applied to the program operation.

In the above-described programming method, it is possible to determine and recover lower bit data, such as first page data and LSB data, even where a sudden loss of power occurs during a process of programming MSB data. As compared with FIG. 2B, the above-described program method does not include a range "X" associated with ambiguous programming states as discussed above.

In some instances, a sudden loss of power occurs in the first MSB program operation. In this case, memory cells in the erase state "E" store lower bit data '1', and memory cells in program states P0 and P2 state store lower bit data '0'. Accordingly, it is possible to exactly judge and recover lower bit data stored in memory cells.

In some instances, the sudden loss of power occurs during the second MSB program operation. Following the power loss, memory cells having a threshold voltage greater than verify voltage VFY2 store lower bit data '0' and memory cells having a threshold voltage lower than verify voltage VFY2 store lower bit data '1'. Thus, it is possible to determine and recover lower bit data stored in memory cells even when power is lost during a second MSB program operation such as that illustrated in FIG. 3C. As compared with FIG. 2B, the program method described in relation to FIGS. 3A through 3C does not include a range "X" associated with ambiguous programming states as discussed above.

The above-described embodiments are provided as teaching examples, and the inventive concept may be embodied in various alternative forms. For example, data stored in memory cells in the first MSB program operation may be transferred to the first latch and data loaded from an external source for the second MSB programming operation may be transferred to the second latch. The transfer of data to the first and second latches can be made at the same time.

Figure 4:
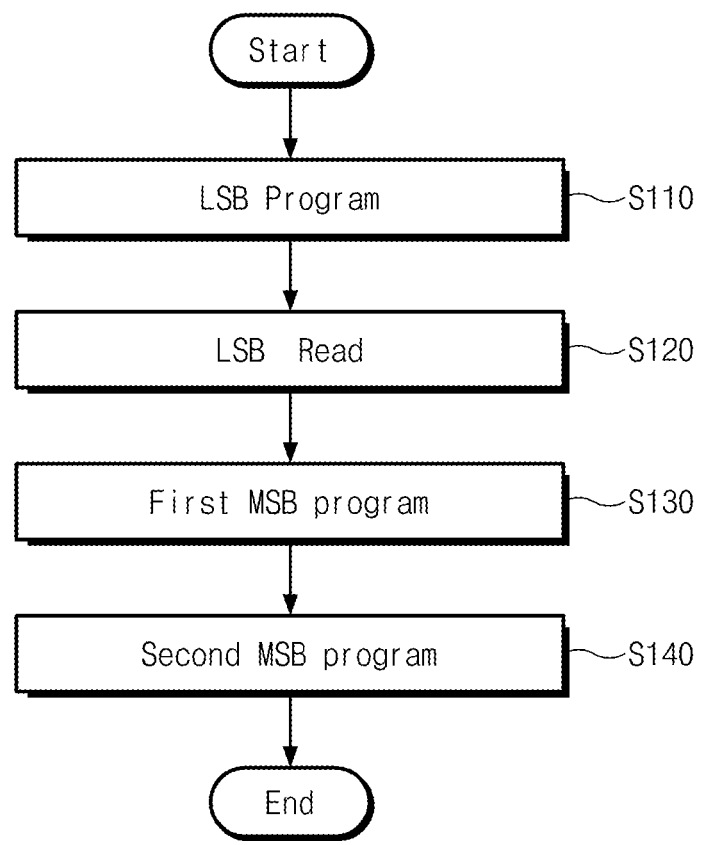
FIG. 4 is a flowchart illustrating a method of programming a nonvolatile memory device in accordance with an embodiment of the inventive concept.

FIG. 4 is a flowchart illustrating a method of programming a nonvolatile memory device in accordance with an embodiment of the inventive concept.

Referring to FIG. 4, lower bit data, such as LSB data, is programmed to selected memory cells by a lower bit data program operation in step S110. In the lower bit program operation, lower bit data is loaded into data input/output circuit 130. Data input/output circuit 130 then drives bit lines with voltages corresponding to the loaded lower bit data, and address decoder 120 applies a program voltage Vpgm to a selected page of memory cells via a word line. Address decoder 120 operates under the control of program control logic 140. Under these bias conditions, the loaded lower bit data may be stored in selected memory cells of memory cell array 110.

Next, in step S120 a lower bit read operation is performed to read lower bit data from the selected memory cells. In the lower bit read operation, data input/output circuit 130 applies a power supply voltage to the bit lines of the selected memory cells. Address decoder 120 applies a read voltage through a word line to memory cells in a selected page. Where a memory cell in the selected page has a programmed state (e.g., storing data '0'), it may remain turned off when the read voltage is applied. Accordingly, the corresponding bit line may maintain substantially the same voltage as when the read voltage is not applied thereto, allowing the memory cell to be detected as having the programmed state. On the other hand, where the memory cell in the selected page has an erased state, it may be turned on by the read voltage. In this case, the voltage on the corresponding bit line may drop, causing so that the memory cell is judged to have the erased state.

Next, in step S130, a first MSB program operation is carried out based on lower bit data read in step S120. Step 130 is described in further detail below with reference to FIG. 5.

In step S140, the second MSB program operation is carried out on memory cells programmed by the first MSB program operation in step S130. The second MSB program operation may be performed as illustrated in FIG. 3. As indicated in FIG. 3, memory cells in program state P0 state are programmed to program state P2 during the first MSB program operation, and in the second MSB program operation no further operations are required to place memory cells in program state P2.

Figure 5:
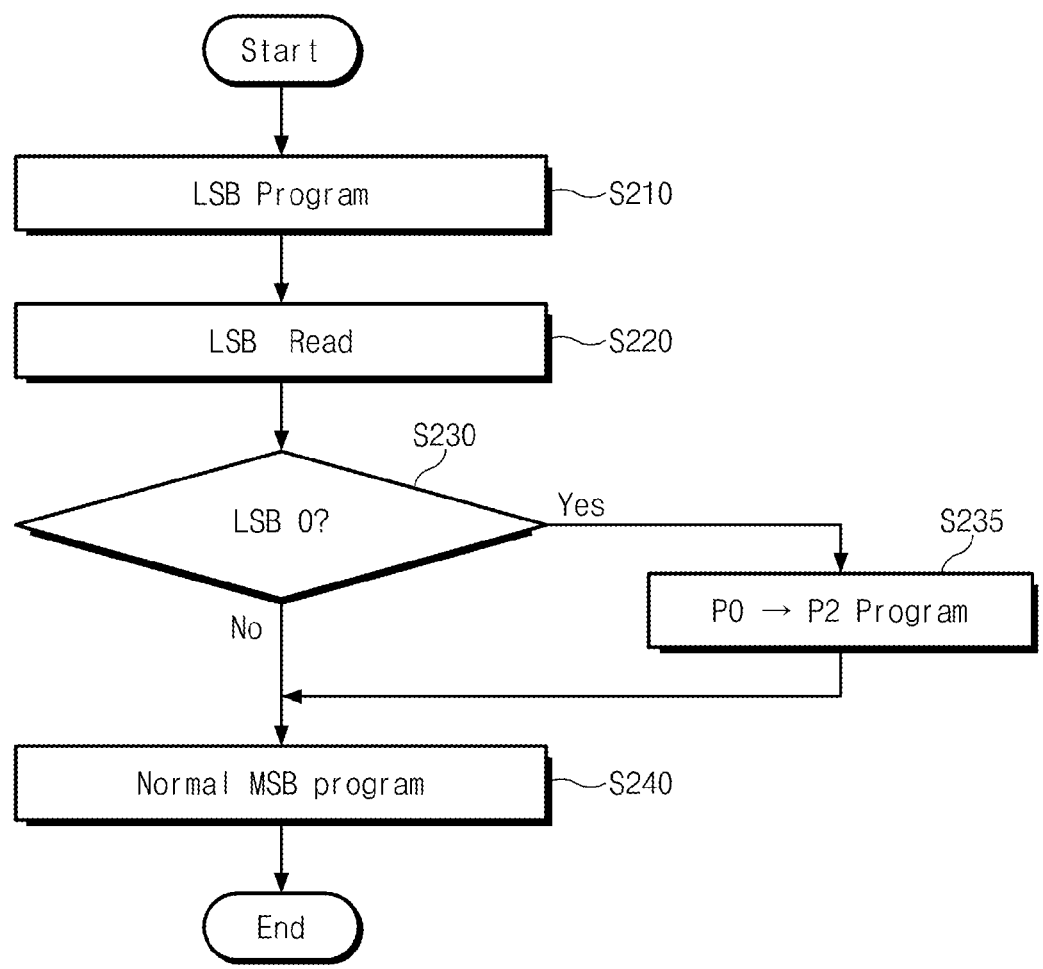
FIG. 5 is a flowchart illustrating a method of programming a nonvolatile memory in accordance with another embodiment of the inventive concept.

FIG. 5 is a flowchart illustrating a method of programming a flash memory in accordance with an embodiment of the inventive concept.

Referring to FIG. 5, in step S210 lower bit data is programmed to selected memory cells by biasing a selected word line with a program voltage Vpgm and biasing selected bit lines with voltages corresponding to lower bit data loaded in a page buffer. Step S210 may be performed substantially identical to step S110 of FIG. 4, and therefore additional description thereof will be omitted to avoid redundancy.

In step S220, a read voltage is applied to memory cells in which lower bit data is programmed, and lower bit data is read out of those memory cells. The process of reading lower bit data is identical to the process described in relation to step S120 of FIG. 4, and therefore additional description thereof will be omitted to avoid redundancy.

In step S230, a determination is made as to whether LSB-programmed memory cells are in a programmed state or an erased state. Where the LSB-programmed memory cells are judged to have the programmed state (S230=YES), the method proceeds to step S235; otherwise (S240=NO), the method proceeds to step S240. In step S235, memory cells in program state P0 state are programmed to program state P2. This programming operation can be performed using a program voltage increased in iterative stepwise loops each comprising a program operation and a program-verify operation. Where the LSB-programmed memory cells are judged to have the erased state, the procedure advances to step S240 without programming memory cells having the erased state. In step S240, the second MSB program operation may be carried out.

In step S240, memory cells to be programmed with data '11' may remain in erase state "E", as indicated, for instance, in FIGS. 3B and 3C. Similarly, memory cells to be programmed with data '00' may remain in program state P2 during step S240. Finally, in step S240, the process of programming memory cells to have program state P3 may be performed as illustrated in FIG. 3C.

The method of FIG. 5 may be adapted for programming memory cells storing more than two bits. As an example, the following description presents a method of programming memory cells with three bits.

FIG. 6A is a threshold voltage diagram illustrating multi-level cells with four states for storing two bits of data, and FIG. 6B is a threshold voltage diagram illustrating multi-level cells with eight states for storing three bits of data. For explanation purposes, it will be assumed that the two bits in FIG. 6A correspond to two pages of data programmed in selected memory cells connected to a selected word line, and the three bits in FIG. 6B correspond to three pages of data programmed in the selected memory cells.

Referring to FIG. 6A, multi-level cells storing two pages of data each have one of states PS1 through PS4. Among these, a program state PS1 has the highest threshold voltage distribution, and an erase state PS4 has the lowest threshold voltage distribution. States PS1 through PS4 correspond to 2-bit data '00', '10', '01', and '11', respectively. However, the order of 2-bit data '00', '10', '01', and '11' may be rearranged in alternative embodiments.

Referring to FIG. 6B, after a third page of data is loaded, the selected multi-level cells are further programmed such that each multi-level cell transitions from one of states PS1 through PS4 to one of states S1 through S8.

As indicated in FIG. 6B, memory cells in program state PS1 may be programmed to one of states S1 and S2. A program operation and a program-verify operation may be made with respect to state S1 to store data '0' in the third page. After the program-verify operation for state S1 is completed, a program operation and a program-verify operation may be made with respect to state S2 corresponding to a data '1' in the third page. Memory cells in each of the remaining states PS2 and PS3 may be programmed in a similar manner as program state PS1. On the other hand, some memory cells in program state PS4 may be programmed to have state S7. Memory cells programmed with data '111' remain in program state PS4, which is labeled state S8 in FIG. 6B. After the third page is programmed, eight states S1 through S8 may correspond to 3-bit data '000', '100', '010', '110', '001', '101', '011', and '111', respectively.

Referring to FIGS. 6A and 6B, memory cells having a threshold voltage within a range "20" when storing two bits of data, as indicated at the bottom of FIG. 6B, may suffer defects similar to the memory cells having a threshold voltage in range "X" of FIG. 2 as discussed above. In this case, if power is unexpectedly lost when programming the third bit of data, a memory cell previously in state PS1 may assume an ambiguous value of the third bit. In other words, depending on when the power is lost, the memory cell initially having its threshold voltage in the range "20" may store third bit data '0', as in state S3, or third bit data '1', as in state S2.

The second page of data stored in memory cells of the S5 state in a period 22 may be data 0, and the second page of data stored in memory cells of the PS2 state in the period 22 may be data 1. Further, the second page of data stored in memory cells of the S7 state in a period 24 may be data 1, and the second page of data stored in memory cells of the PS3 state in the period 24 may be data 0. Similar programming detects may occur with memory cells having threshold voltages within ranges "22" and "24" when storing two bits of data. Accordingly, a solution similar to that of FIG. 3 is employed to prevent programming defects from occurring when a memory cell is programmed with three bits of data. The 3-bit case analogous to the 2-bit case of FIG. 3 is presented in FIG. 7.

FIG. 7A is a threshold voltage diagram illustrating states of the selected memory cells storing two pages of data as in FIG. 6A. FIG. 7B is a threshold voltage diagram illustrating states of the selected memory cells which are programmed from the states of FIG. 7A into intermediate states as a first stage in a two stage upper bit programming operation.

In the description that follows, a process of programming memory cells from states PS1 through PS4 to states S2, S4, S6, and S8 may be referred to as the first stage of an MSB program operation or upper bit operation, or a first MSB program operation. Similarly, a process of programming memory cells from states S2, S4, S6, and S8 to states S1 through S8 may be referred to as a second stage of an MSB program operation or upper bit program operation, or a second MSB program operation.

FIG. 7A illustrates program states PS1 through PS4 of memory cells in which second page of data is programmed. In this example, program state PS1 has a highest threshold voltage distribution, and erase state PS4 may has the lowest threshold voltage distribution.

FIG. 7B, illustrates states of the selected memory cells after the first MSB program operation. The first MSB program operation is described in more detail below.

In the first MSB program operation, a read operation is carried out on memory cells connected to a selected word line. Next, memory cells in program state PS1 are programmed to have state S2 based on the read data. Memory cells in program state PS2 may be programmed to state S4 based on the read-out data, and memory cells in program state PS3 may be programmed to have state S6 based on the read-out data. Meanwhile, memory cells in program state PS4 state may maintain the same threshold voltage distribution, indicated as state S8. As illustrated by FIGS. 7A and 7B, the above-described first MSB program process produces threshold voltage distributions S6, S4, and S2 that are narrowed relative to the threshold voltage distributions corresponding to program states PS3 through PS1.

Referring to FIG. 7C, memory cells in program state S2 may be selectively programmed to state S1, or they may remain in program state S2. Memory cells in state S4 may be selectively programmed to state S3 or they may remain in state S4. Memory cells in state S6 may be selectively programmed to state S5 or they may remain in state S6. Memory cells in state S8 may be selectively programmed to state S7 or they may remain in state S8.

Threshold voltage distributions of memory cells experiencing the first MSB program operation may be narrower than those of memory cells not experiencing the first MSB program operation. Accordingly, threshold voltage distributions of memory cells experiencing the first MSB program operation will not overlap with those of memory cells experiencing the second MSB program operation. Therefore, the second page of data may be recovered safely even where power is suddenly lost during upper bit or MSB programming Accordingly, the first MSB program operation prevents loss or defects of stored data.

Figure 6:
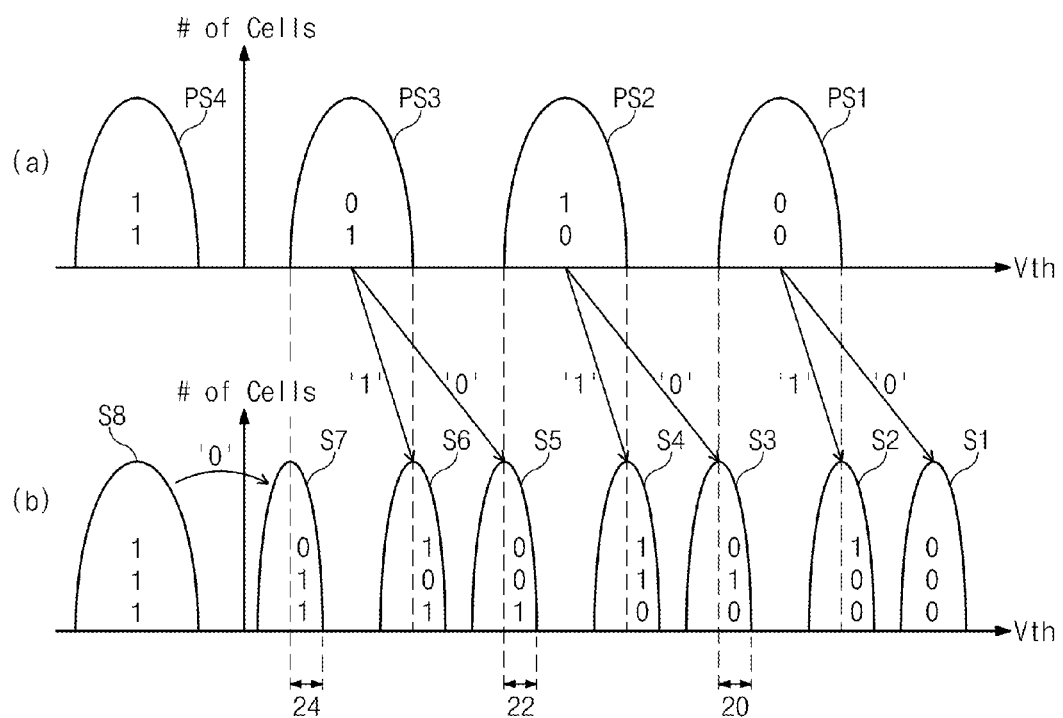
FIG. 6A a threshold voltage diagram illustrating four possible states of a memory cell programmed with two bits of data.
FIG. 6B is a threshold voltage diagram illustrating eight possible states of a memory cell programmed with three bits of data from the four states illustrated in FIG. 6A.
Figure 7:
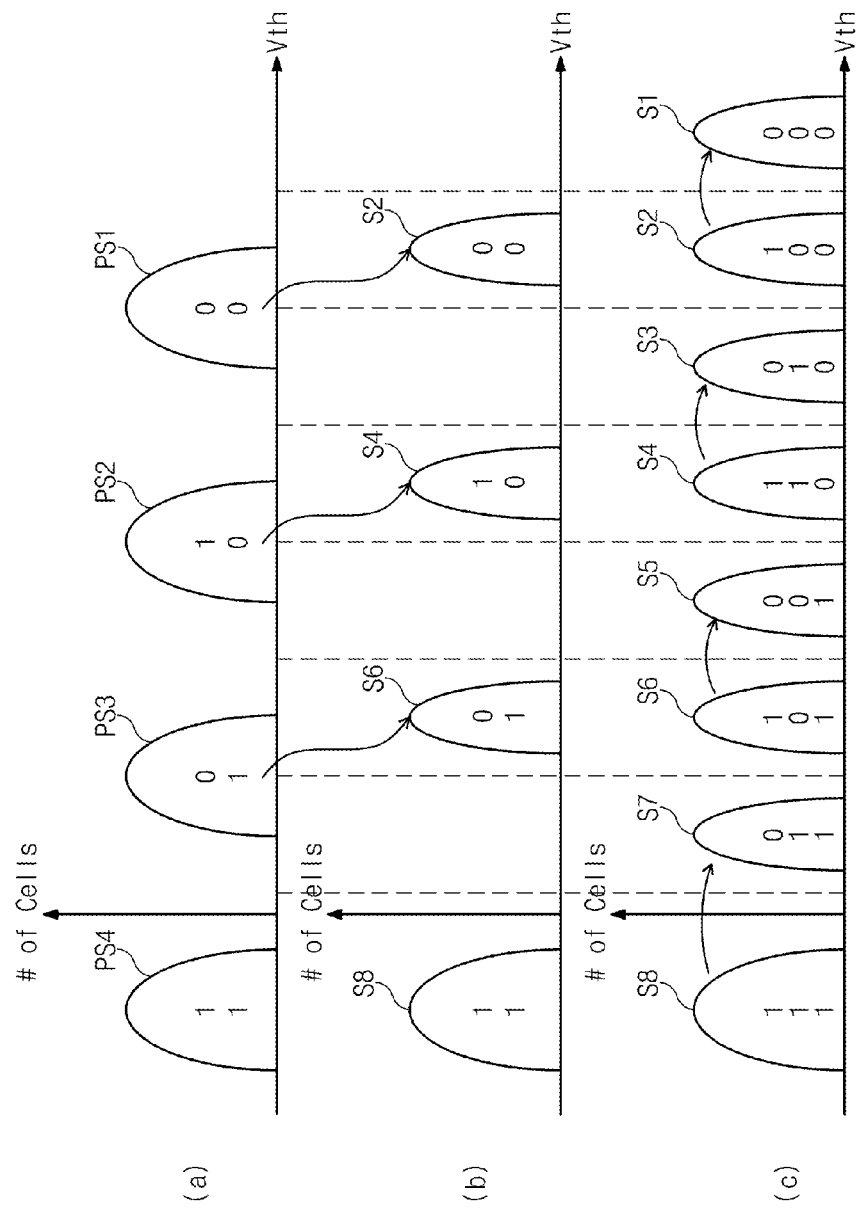
FIG. 7A is a threshold voltage diagram illustrating four possible initial states of a memory cell storing two bits before being programmed with a third bit.
FIG. 7B is a threshold voltage diagram illustrating four possible states of the memory cell of FIG. 7A following a first stage of a two stage operation for programming a third bit of data.
FIG. 7C is a threshold voltage diagram illustrating eight possible states of the memory cell of FIG. 7A following a second stage of the two stage operation for programming a third bit of data.

In the program operations illustrated in FIGS. 6 and 7, ISPP may be used to perform the program operations. In other words, the threshold voltages of the programmed memory cells may be gradually changed using incremental step pulses in combination with verification of the programmed threshold voltages. Stated yet another way, the ISPP may comprise an iterated loop where a stepwise increased program voltage is applied to a selected word line, followed by a verification voltage.

In various embodiments, different program and verification voltages are used to shift the threshold voltages of different memory cells to different states. For instance, different program and verification voltages may be used to shift threshold voltages from an initial state to an intermediate state. In general, the different program and verification voltages tend to vary based on the respective states of memory cells. For instance, a start voltage level of a program voltage used on a memory cell in a current state may be different from that used on a memory cell in a middle state.

Although the embodiments of FIGS. 1-7 relate to the programming memory cells with two and three bit memory cells, the inventive concept is not limited to these numbers of memory cells. For instance, in other embodiments, n-bit memory cells could be programmed using a two stage upper bit programming operation such as that illustrated in FIGS. 3 and 7, where "n" is an integer greater than three. Moreover, the inventive concept is not limited to using the two stage program operation as an upper bit program operation. For instance, in some embodiments, upper bits (e.g., more significant bits) may be programmed before lower bits.

Figure 8:
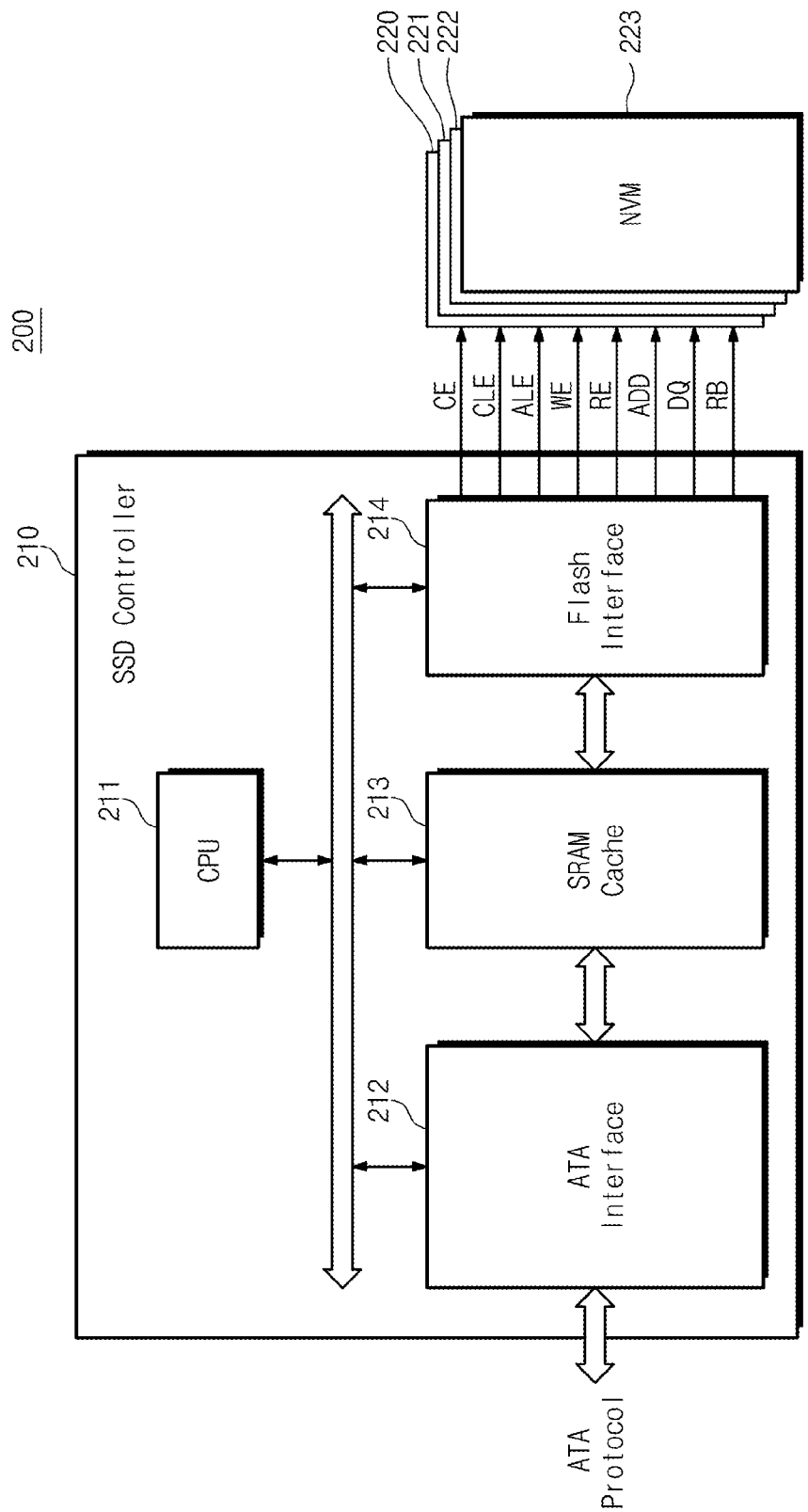
FIG. 8 is a block diagram illustrating a solid state drive (SSD) device in which the programming methods of FIGS. 3 and 7 may be implemented.

FIG. 8 is a block diagram illustrating a solid state drive device 200 in which the program methods of FIGS. 3 and 7 may be implemented. Referring to FIG. 8, solid state drive 200 comprises an SSD controller 210 and nonvolatile memories 220 through 223. SSD controller 210 comprises a CPU 211, an ATA interface 212, an SRAM cache 213, a flash interface 214, and an auxiliary power supply (not shown).

Figure 9:
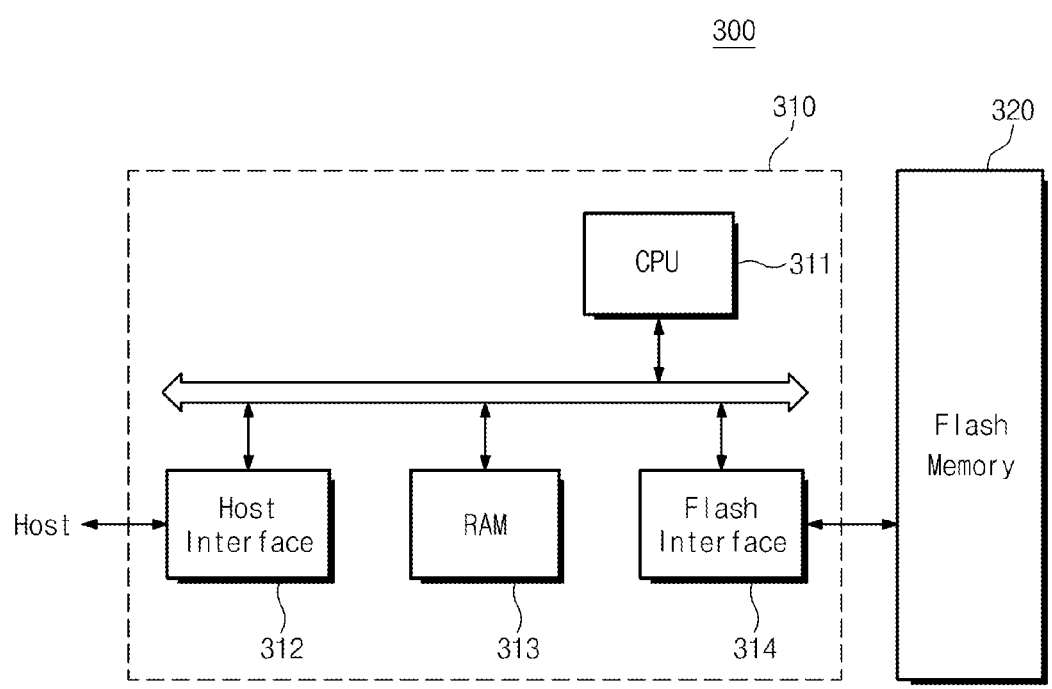
FIG. 9 is a block diagram illustrating a semiconductor memory device in which programming methods of FIGS. 3 and 7 may be implemented.

FIG. 9 is a block diagram illustrating a semiconductor memory device 300 in which the program methods in FIGS. 3 and 7 may be implemented. Referring to FIG. 9, semiconductor memory device 300 comprises a memory controller 310 and a flash memory 320. Moreover, semiconductor memory device 300 may be implemented as a storage device having both volatile and nonvolatile memory devices, such as a memory card, such as an SD card or MMC card, or a removable and portable storage device, such as a USB memory. As illustrated in FIG. 9, memory controller 310 comprises a CPU 311, a host interface 312, a RAM 313, and a flash interface 314. In an example embodiment, memory controller 310 is configured to control the program operations performed in accordance with embodiments of the inventive concept.

Figure 10:
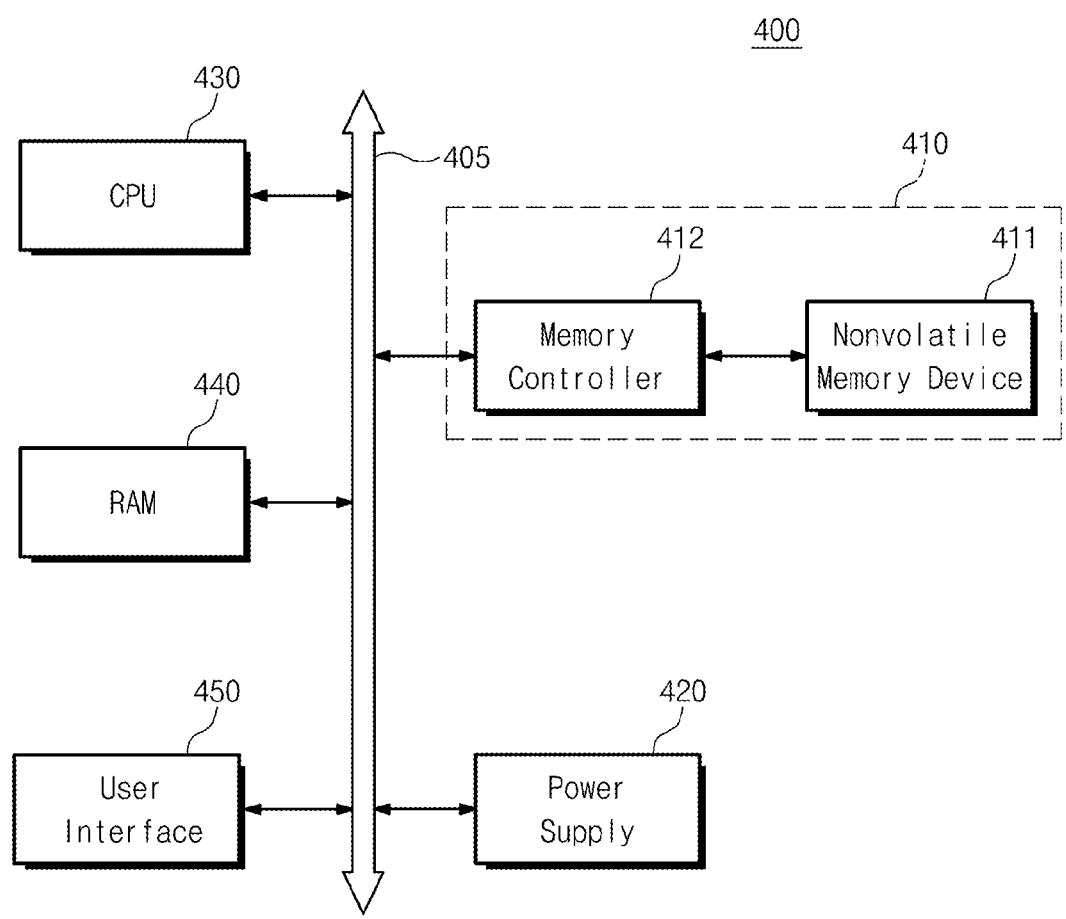
FIG. 10 is a block diagram illustrating a user device in which programming methods of FIGS. 3 and 7 may be implemented.

FIG. 10 is a block diagram illustrating a user device 400 in which program methods of FIGS. 3 and 7 may be implemented. User device 400 may be a personal computer or portable electronic devices such as a notebook computer, a cellular phone, PDA, a camera, and the like.

Referring to FIG. 10, user device 400 comprises a bus and power line 405, a memory system 410, a power supply 420, CPU 430, RAM 440, and a user interface 450. Memory system 410 comprises a nonvolatile memory device 411 and a controller 412.

Controller 412 is connected with nonvolatile memory device 411. Controller 412 is configured to read data from nonvolatile memory device 411 and store data in nonvolatile memory device 411.

Controller 412 typically comprises constituent elements such as RAM, processing unit, a host interface, and a memory interface. The RAM may be used as a working memory of the processing unit. The processing unit may control an overall operation of controller 412. The host interface may implement a protocol for performing data exchange between a host and controller 412. The memory interface may interface with nonvolatile memory device 411. Controller 412 may further comprise an error correction code (ECC) block configured to detect and correct errors within data read from nonvolatile memory device 411.

In some embodiments, controller 412 is configured to communicate with an external device, such as a host, via one of various interface protocols such as USB, MMC, PCI-E, Advanced Technology Attachment (ATA), Serial-ATA, Parallel-ATA, SCSI, ESDI, and Integrated Drive Electronics (IDE).

Nonvolatile memory device 411 comprises a memory cell array for storing data, a read/write circuit for writing and reading data in and from the memory cell array, an address decoder configured to decode an externally provided address and transfer the decoded address to the read/write circuit, control logic configured to control the operation of nonvolatile memory device 411.

Controller 412 and nonvolatile memory device 411 may be integrated to form one semiconductor device such as a memory card. For example, controller 412 and flash memory 411 may be integrated to form a PCMCIA card, a compact flash (CF) card, a smart media (SM) card, a memory stick, a multi-media card (MMC), a reduced-size multimedia card (RS-MMC), an MMCmicro card, a secure digital (SD) card, a miniSD card, a microSD card, or a universal flash storage (UFS) card, to name but a few.

Alternatively, controller 412 and nonvolatile memory device 411 may be integrated to form a solid state drive/disk (SSD). Where memory system 410 is used as the SSD, an operating speed of a device connected with the user device 400 may be improved remarkably.

Memory system 410 may be implemented in various types of devices, such as a computer, portable computer, ultra-mobile personal computer (UMPC), workstation, net-book, personal digital assistant (PDA), web tablet, wireless phone, mobile phone, smart phone, digital camera, digital audio recorder or player, digital picture/video recorder or player, a device capable of transmitting and receiving information at a wireless circumstance, one of various electronic devices constituting home network, one of various electronic devices implementing a computer network, one of various electronic devices implementing a telematics network, or one of various electronic devices implementing a computing system such as SSD or memory card.

Nonvolatile memory device 411 and/or memory system 410 may be formed in any of several different packaging configurations, such as a package on package (PoP), ball grid array (BGA), chip scale packages (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), a multi chip package (MCP), a wafer-level fabricated package (WFP), or a wafer-level processed stack package (WSP), to name but a few.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of programming a nonvolatile memory device, comprising:
selectively programming memory cells in a first state to a second state based on lower bit data, the first state corresponding to a first threshold voltage distribution and the second state corresponding to a second threshold voltage distribution whose voltage range is higher than a voltage range of the first threshold voltage distribution;
programming a portion of memory cells in the second state to a middle state corresponding to a middle threshold voltage distribution whose voltage range is overlapping with or higher than the voltage range of the second threshold voltage distribution; and then
selectively programming memory cells in the first state to a third state corresponding to a third threshold voltage distribution whose voltage range is higher than the voltage range of the first threshold voltage distribution and selectively programming the portion of memory cells and memory cells in the second state to a fourth state and a fifth state based on upper bit data, the fourth state corresponding to a fourth threshold voltage distribution whose voltage range is higher than a voltage range of the third threshold voltage distribution and the fifth state corresponding to a fifth threshold voltage distribution whose voltage range is higher than a voltage range of the fourth threshold voltage distribution.

2. A method of programming a nonvolatile memory device, comprising:
performing a lower bit program operation on memory cells based on lower bit data such that each memory cell has one of an erase state and a program state; and then
performing an upper bit program operation on the memory cells based on the lower bit data and upper bit data such that each memory cell remains in the erase state or has one of first through third program states,
wherein the performing the upper bit program operation includes
performing a first program operation on a portion of the memory cells in the program state by applying a first program voltage to the portion of the memory cells based on the lower bit data to increase threshold voltages of the portion of the memory cells in the program state; and then
performing a second program operation on the memory cells such that each memory cell in the erase state remains in the erase state or has the first program state and each memory cell in the program state or each memory cell having increased threshold voltage by the first program operation has the second program state or the third program state,
wherein the second program operation are executed by an incremental step pulse program,
wherein the first program voltage is higher than an initial voltage of the incremental step pulse program,
wherein each memory cells having the erase state or the first program state is program-inhibited during applying the first program voltage to the portion of the memory cells.

3. A nonvolatile memory device comprising:
a memory cell array comprising memory cells arranged in rows and columns;
a read/write circuit configured to receive data from and supply data to the memory cell array; and
a control logic component configured to control the read/write circuit such that memory cells in a first state are selectively programmed to a second state based on lower bit data, a portion of memory cells in the second state are programmed to a middle state, memory cells in the first state are selectively programmed to a third state, and the portion of the memory cells and memory cells in the second state are selectively programmed to a fourth state and a fifth state based on upper bit data, wherein the first state corresponds to a first threshold voltage distribution, the second state corresponds to a second threshold voltage distribution whose voltage range is higher than a voltage range of the first threshold voltage distribution, the middle state corresponds to a middle threshold voltage distribution whose voltage range is overlapping with or higher than the voltage range of the second threshold voltage distribution, the third state corresponds to a third threshold voltage distribution whose voltage range is higher than the voltage range of the first threshold voltage distribution, the fourth state corresponds to a fourth threshold voltage distribution whose voltage range is higher than the voltage range of the third threshold voltage distribution, and the fifth state corresponds to a fifth threshold voltage distribution whose voltage range is higher than the voltage range of the fourth threshold voltage distribution.

4. A nonvolatile memory device comprising:

a memory cell array comprising memory cells arranged in rows and columns;

a read/write circuit configured to receive data from and supply data to the memory cell array; and a control logic component configured to control the read/write circuit such that memory cells are programmed by a lower bit program operation and an upper bit program operation subsequent to the lower bit program operation, wherein the lower bit program operation programs the memory cells based on lower bit data such that each memory cell remains an erase state or has a program state, wherein the upper bit program operation programs the memory cells based on the lower bit data and upper bit data such that each memory cell remains the erase state or has one of first through third program states, wherein the upper bit program operation includes a first program operation and a second program operation subsequent to the first program operation, wherein the first program operation programs a portion of the memory cells in the program state by applying a first program voltage to increase threshold voltages of the portion of the memory cells in the program state, wherein the second program operation programs the memory cells such that each memory cell in the erase state remains the erase state or has the first program state and each memory cell in the program state or each memory cell having increased threshold voltage by the first program operation has the second program state or the third program state, wherein the second program operation are executed by an incremental step pulse program, wherein the first program voltage is higher than an initial voltage of the incremental step pulse program, wherein each memory cells having the erase state or the first program state is program-inhibited during applying the first program voltage to the portion of the memory cells.

5. A memory system comprising:

a nonvolatile memory device; and a controller configured to control the nonvolatile memory device, wherein the nonvolatile memory device comprises:

a memory cell array;

a data input/output circuit configured to receive data from and supply data to the memory cell array; and a control logic component configured to control the read/write circuit such that memory cells in a first state are selectively programmed to a second state based on lower bit data, a portion of memory cells in the second state are programmed to a middle state, memory cells in the first state are selectively programmed to a third state, and the portion of the memory cells and memory cells in the second state are selectively programmed to a fourth state and a fifth state based on upper bit data, wherein the first state corresponds to a first threshold voltage distribution, the second state corresponds to a second threshold voltage distribution whose voltage range is higher than a voltage range of the first threshold voltage distribution, the middle state corresponds to a middle threshold voltage distribution whose voltage range is overlapping with or higher than the voltage range of the second threshold voltage distribution, the third state corresponds to a third threshold voltage distribution whose voltage range is higher than the voltage range of the first threshold voltage distribution, the fourth state corresponds to a fourth threshold voltage distribution whose voltage range is higher than the voltage range of the third threshold voltage distribution, and the fifth state corresponds to a fifth threshold voltage distribution whose voltage range is higher than the voltage range of the fourth threshold voltage distribution.

6. A memory system comprising:

a nonvolatile memory device; and a controller configured to control the nonvolatile memory device, wherein the nonvolatile memory device comprises:

a memory cell array;

a data input/output circuit configured to receive data from and supply data to the memory cell array; and a control logic component configured to control the read/write circuit such that memory cells are programmed by a lower bit program operation and an upper bit program operation subsequent to the lower bit program operation, wherein the lower bit program operation programs the memory cells based on lower bit data such that each memory cell remains an erase state or has a program state, wherein the upper bit program operation programs the memory cells based on the lower bit data and upper bit data such that each memory cell remains the erase state or has one of first through third program states, wherein the upper bit program operation includes a first program operation and a second program operation subsequent to the first program operation, wherein the first program operation programs a portion of the memory cells in the program state by applying a first program voltage to increase threshold voltages of the portion of the memory cells in the program state, wherein the second program operation programs the memory cells such that each memory cell in the erase state remains the erase state or has the first program state and each memory cell in the program state or each memory cell having increased threshold voltage by the first program operation has the second program state or the third program state, wherein the second program operation are executed by an incremental step pulse program, wherein the first program voltage is higher than an initial voltage of the incremental step pulse program, wherein each memory cells having the erase state or the first program state is program-inhibited during applying the first program voltage to the portion of the memory cells.

* * * * *